United States Patent
Ebara

(10) Patent No.: US 7,919,847 B2
(45) Date of Patent: Apr. 5, 2011

(54) SEMICONDUCTOR WAFER, SEMICONDUCTOR DEVICE, AND SEMICONDUCTOR DEVICE MANUFACTURING METHOD

(75) Inventor: Atsushi Ebara, Hyogo-ken (JP)

(73) Assignee: Ricoh Company, Ltd., Tokyo (JP)

( * ) Notice: Subject to any disclaimer, the term of this patent is extended or adjusted under 35 U.S.C. 154(b) by 1031 days.

(21) Appl. No.: 11/713,436

(22) Filed: Mar. 2, 2007

(65) Prior Publication Data
US 2008/0210935 A1 Sep. 4, 2008

(30) Foreign Application Priority Data
Mar. 2, 2006 (JP) .................. 2006-055998

(51) Int. Cl.
*H01L 23/48* (2006.01)
(52) U.S. Cl. ........... 257/690; 257/48; 257/E23.01
(58) Field of Classification Search ........... 257/48, 257/758, 690, 692–693, 750, 752, 755, E21.521, 257/E23.01
See application file for complete search history.

(56) References Cited

U.S. PATENT DOCUMENTS
5,648,661 A * 7/1997 Rostoker et al. ............... 257/48

FOREIGN PATENT DOCUMENTS
| JP | 10-303259 | 11/1998 |
| JP | 2002-93812 | 3/2002 |
| JP | 2002-329742 | 11/2002 |
| JP | 2003-86707 | 3/2003 |
| JP | 2003-289104 | 10/2003 |

OTHER PUBLICATIONS

Official action in connection with a counterpart Korean patent application No. 10-2007-0020913 (and English translation thereof).

* cited by examiner

*Primary Examiner* — Davienne Monbleau
*Assistant Examiner* — Hoa B Trinh
(74) *Attorney, Agent, or Firm* — Cooper & Dunham LLP

(57) ABSTRACT

A semiconductor wafer includes a plurality of chip areas, a scribe line area, a bonding pad, a probing pad, and a pad connection wiring. The plurality of chip areas are configured to be arranged in a matrix form. The scribe line area is configured to separate the plurality of chip areas from each other. The bonding pad is configured to be connected with an external terminal. The probing pad is configured to be contacted with a probe wire. The pad connection wiring is configured to electrically connect the bonding pad to the probing pad. The bonding pad and the probing pad are located at a predetermined distance from each other in each of the plurality of chip areas. The pad connection wiring has a portion located in the scribe line area.

16 Claims, 12 Drawing Sheets

SEMICONDUCTOR WAFER, SEMICONDUCTOR DEVICE, AND SEMICONDUCTOR DEVICE MANUFACTURING METHOD

TECHNICAL FIELD

This patent specification relates to a semiconductor device and a manufacturing method thereof, and more particularly to a semiconductor device capable of effectively suppressing a short circuit and a manufacturing method thereof.

DISCUSSION OF THE RELATED ARTS

Generally, semiconductor wafers have a plurality of chip areas that are separated from each other by a scribe line area. Each chip area is provided with elements and components to form a semiconductor device. The semiconductor wafer is diced along the scribe line area into individual pieces of the semiconductor devices.

In a related semiconductor wafer, each chip area is provided with a bonding pad and a probing pad. The bonding pad is electrically connected with an external connection terminal, such as a bonding wire or a solder bump. On the other hand, the probing pad is contacted with a probe wire during a wafer test. In a related semiconductor wafer, as illustrated in FIG. 1, a bonding pad 9 may be located adjacent to an input-and-output cell 7 in a chip area 3. On the other hand, recently, a multilayer metal wiring structure has been increasingly employed in semiconductor wafers. The multilayer structure allows the bonding pad to be located on the top of the input-and-output cell, thereby facilitating reduction of the size of the semiconductor device.

When the bonding pad is located on the top of the input-and-output cell, however, a contact of the probing wire during a wafer test may cause significant damage to layers under the bonding pad. For this reason, the probing pad is not configured to also perform the function of the bonding pad. The probing pad and the bonding pad are separately provided on the input-and-output cell.

FIGS. 2A and 2B are schematic diagrams illustrating a portion (hereinafter, "pad adjacent portion") adjacent to a bonding pad 9 and a probing pad 11 in a chip area 3 of another related semiconductor wafer. FIG. 2A is a plan view of the pad adjacent portion, while FIG. 2B is a cross-sectional view of the pad adjacent portion seen from a section A-A in FIG. 2A. Incidentally, in FIGS. 2A and 2B, a final protection film and elements, such as a transistor, constituting the input-and-output cell are not illustrated.

In the related semiconductor wafer, the bonding pad 9 and the probing pad 11 are located on the top of the input-and-output cell 7 as illustrated in FIG. 2A.

Next, referring to FIG. 2B, a cross-sectional structure of the pad adjacent portion of FIG. 2A is described.

The related semiconductor wafer is provided with a semiconductor substrate 13, a poly-metal inter-layer insulation film 15, metal wiring layers 17-1 to 17-5, and inter-layer insulation layers 19-1 to 19-4.

The poly-metal inter-layer insulation layer 15 is formed on the semiconductor substrate 13. The poly-metal inter-layer insulation layer 15 insulates a polysilicon layer and the semiconductor substrate from the metal wiring layers 17-1 to 17-5.

The metal wiring layers 17-1 to 17-5 are sequentially formed from bottom up on the poly-metal inter-layer insulation layer 15. The inter-layer insulation layers 19-1 to 19-4 are formed between any two adjacent layers of the metal wiring layers 17-1 to 17-5.

The bonding pad 9 and the probing pad 11 are formed in the metal wiring layer 17-5. A metal wiring layer 17-5c is formed between the bonding pad 9 and the probing pad 11. Through the metal wiring layer 17-5c, the bonding pad 9 and the probing pad 5 are electrically connected to each other on the input-and-output cell 7.

In the above-described case, since the probing pad 11 is located on the top of the input-and-output cell 7, some measure should be taken to suppress the damage of the probing pad 11, which can be caused by the contact of a probe wire during the wafer test. Therefore, in the above related semiconductor wafer, a protection metal layer 17-4c is formed under the probing pad 11 as a portion of the metal wiring layer 17-4. The metal wiring layer 17-4 has via holes, through which the probing pad 11 and the protection metal layer 17-4c are electrically connected to each other.

An internal wiring 17-3c is located under the protection metal layer 17-4c as a portion of the metal wiring layer 17-3. The internal wiring 17-3c is used as a power supply wiring, a ground wiring, a signal wiring, and so forth.

In the related semiconductor wafer as illustrated in FIGS. 2A and 2B, the bonding pad 9 and the probing pad 11 are located at a given distance from each other. Alternatively, in another related semiconductor wafer, the bonding pad 9 and the probing pad 11 may be located adjacent to each other.

As described above, when the bonding pad 9 and the probing pad 11 are separately provided on the semiconductor wafer, a contact scar of the probing pad 11 may be left on the surface of the probing pad 11, but not on the surface of the bonding pad 9. Thus, an increased reliability may be obtained for the connection between the bonding pad 9 and the external connection terminal, such as a bonding wire or a solder bump.

Further, in the related semiconductor wafer as illustrated in FIGS. 2A and 2B, the protection metal layer 17-4c is located under the probing pad 11 so that the damage of the probing pad 11 can be caused by the contact of the probe wire may not spread to the layers under the protection metal layer 17-4c (for example, see Japanese Patent Application Laid-Open No. 2002-329742).

However, when a probing operation with the probing pad 11 is executed at high-temperature, further significant damage may be caused in the probing pad 11. Consequently, the damage may spread to the layers under the protection metal layer 17-4c.

For example, as illustrated in FIG. 3, when the probing pad 11 is contacted with a probe wire 21, a crack 23 may be generated in the inter-layer insulation film 19-4 and the inter-layer insulation film 19-3. Then, the crack 23 may cause a corrosion over time, further resulting in a short circuit between the probing pad 11 and the internal wiring 17-3c.

That is, even when a failure is not found in the wafer test, the probing operation with the probing pad 11 may cause the short circuit between the probing pad 11 and the internal wiring 17-3c. In the above-described related semiconductor wafer as illustrated in FIGS. 2A, 2B, and 3, the probing pad 11 is connected to the bonding pad 9 via the metal wiring layer 17-5c. Therefore, a short circuit may be generated between the bonding pad 9 and the internal wiring 17-3c, which should be essentially insulated from each other. Subsequently, the short circuit may cause damage to an integrated circuit in the semiconductor device, thus deteriorating the reliability thereof.

To suppress such a failure, for example, as illustrated in FIG. 4, a protection metal layer 17-3d may be located under the protection metal layer 17-4c as a portion of the metal wiring layer 17-3.

In the configuration as illustrated in FIG. 4, however, the addition of the protection metal layer 17-3d may decrease freedom in layout of the internal wiring located on the input-and-output cell. For example, a reduction or a relocation of a power supply wiring located on the input-and-output cell may have an effect on the performance of the integrated circuit. Therefore, the addition of the protection metal layer under the probing pad is not so advantageous.

Accordingly, a need exists for a semiconductor wafer, a semiconductor device, and a method for manufacturing the semiconductor device which are capable of effectively suppressing a short circuit which can be caused by the probing operation with the probing pad.

BRIEF SUMMARY

In an aspect of this disclosure, there are provided a semiconductor wafer, a semiconductor device, and a method for manufacturing the semiconductor device which are capable of effectively suppressing a short circuit which can be caused by the probing operation with the probing pad.

In at least one exemplary embodiment, there is provided a semiconductor wafer including a plurality of chip areas, a scribe line area, a bonding pad, a probing pad, and a pad connection wiring. The plurality of chip areas are arranged in a matrix form. The scribe line area separates the plurality of chip areas from each other. The bonding pad is connected with an external terminal. The probing pad is contacted with a probe wire. The pad connection wiring electrically connects the bonding pad to the probing pad. The bonding pad and the probing pad are located at a predetermined spacing from each other in each of the plurality of chip areas. The pad connection wiring has a portion located in the scribe line area.

In at least one exemplary embodiment, there is provided a semiconductor device including the above-described semiconductor wafer. The semiconductor device is formed by cutting the semiconductor wafer along the scribe line area. The bonding pad and the probing pad are electrically separated from each other. The scribe line area has a cut surface including a section of the pad connection wiring connected to the bonding pad and a section thereof connected to the probing pad.

In at least one exemplary embodiment, there is provided a method for producing the above-described semiconductor device. The method includes performing a wafer test while contacting the probe wire to the probing pad, cutting the scribe line area, cutting the pad connection wiring, and electrically separating the bonding pad and the probing pad from each other.

BRIEF DESCRIPTION OF THE DRAWINGS

Additional aspects, features and advantages will be readily obtained as the same becomes better understood by reference to the following detailed description when considered in connection with the accompanying drawings, wherein.

DETAILED DESCRIPTION OF EXEMPLARY EMBODIMENTS

Figure 1:
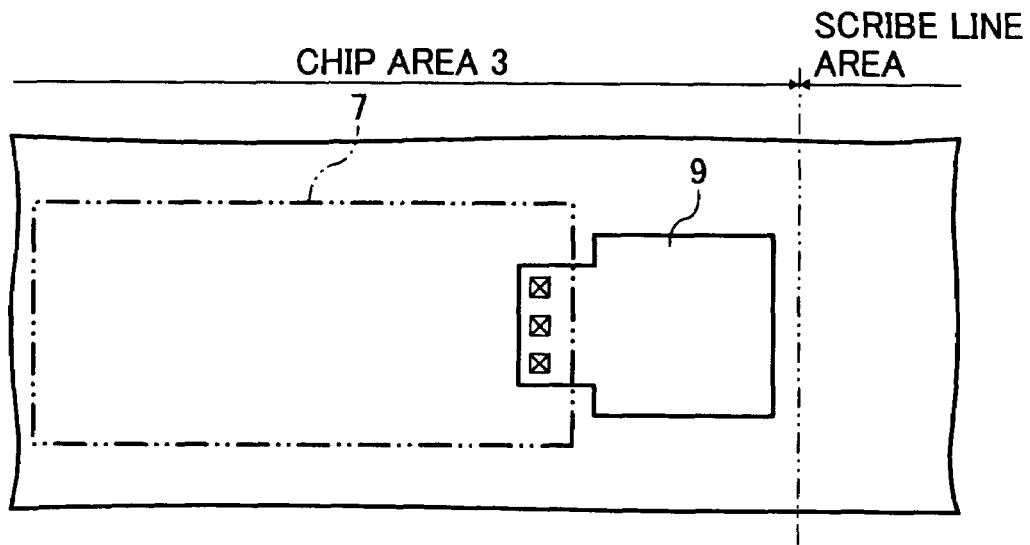
FIG. 1 is a plan view illustrating a pad adjacent portion of a semiconductor wafer according to a related art.
Figure 2A:
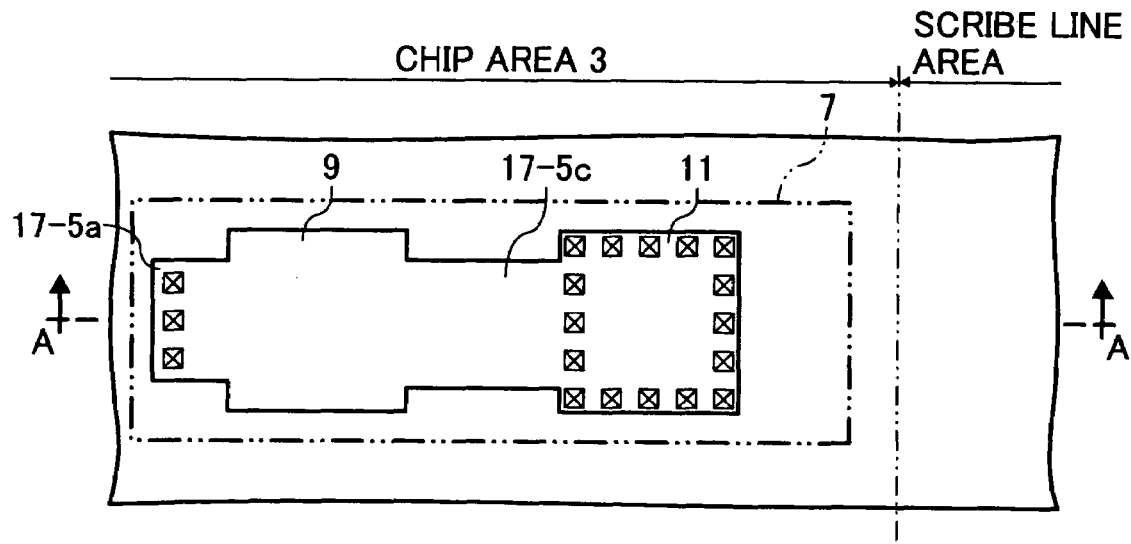
FIG. 2A is a plan view illustrating a pad adjacent portion of a semiconductor wafer according to another related art.
Figure 2B:
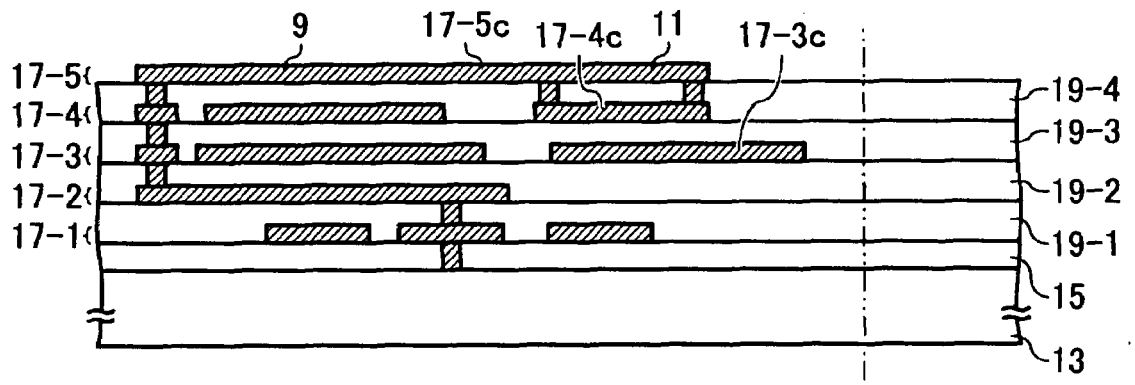
FIG. 2B is a cross-sectional view of the pad adjacent portion seen from a section A-A in FIG. 2A.
Figure 3:
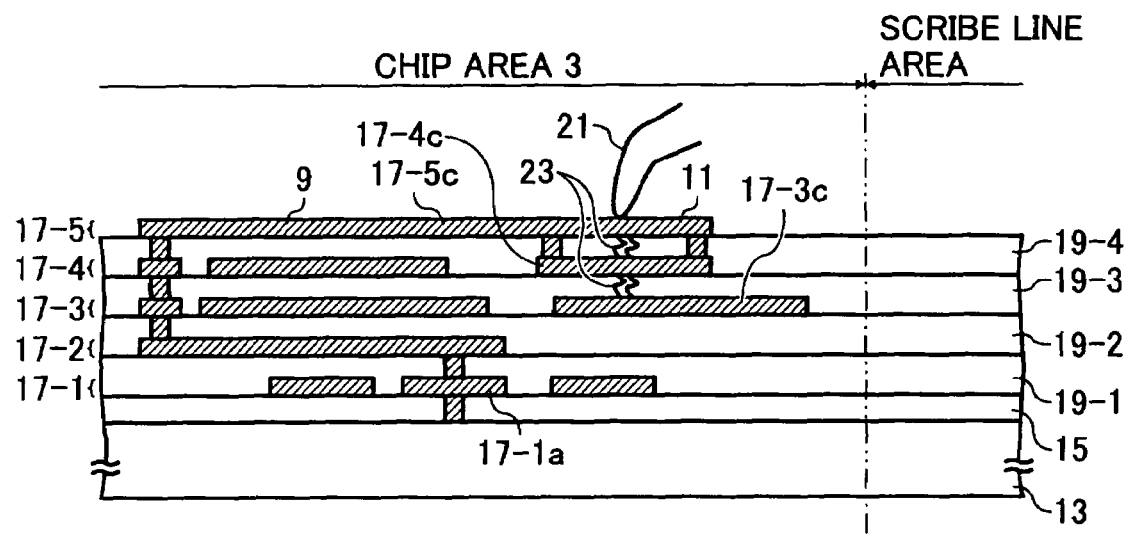
FIG. 3 is a cross-sectional view illustrating a state of the pad adjacent portion of FIG. 2A during a wafer test.
Figure 4:
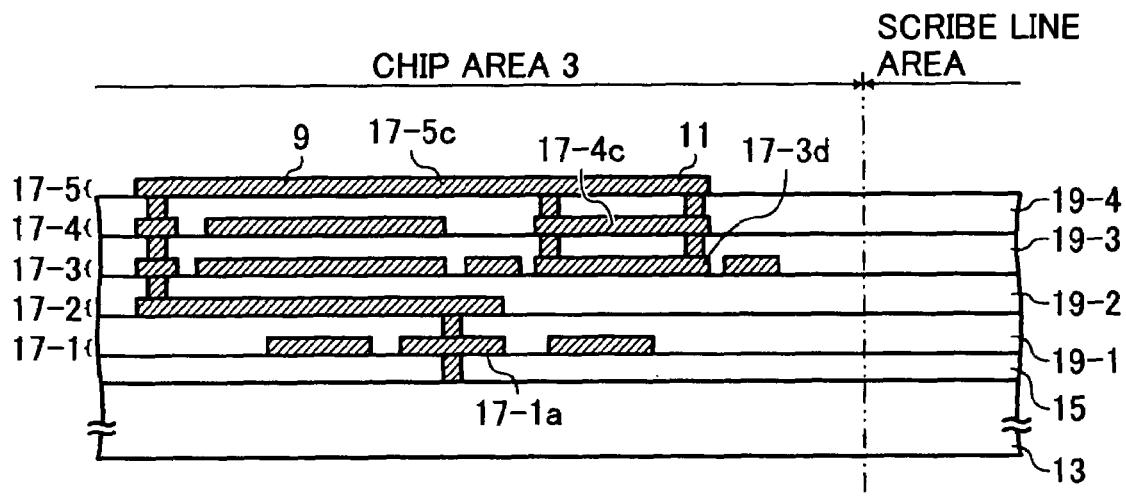
FIG. 4 is a plan view illustrating a pad adjacent portion of a semiconductor wafer according to another related art.

In describing exemplary embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, exemplary embodiments of the present patent specification are described.

First, referring to FIGS. 5A, 5B and 6-8, a semiconductor wafer 100 according to an exemplary embodiment of the present specification is described.

Figure 5A:
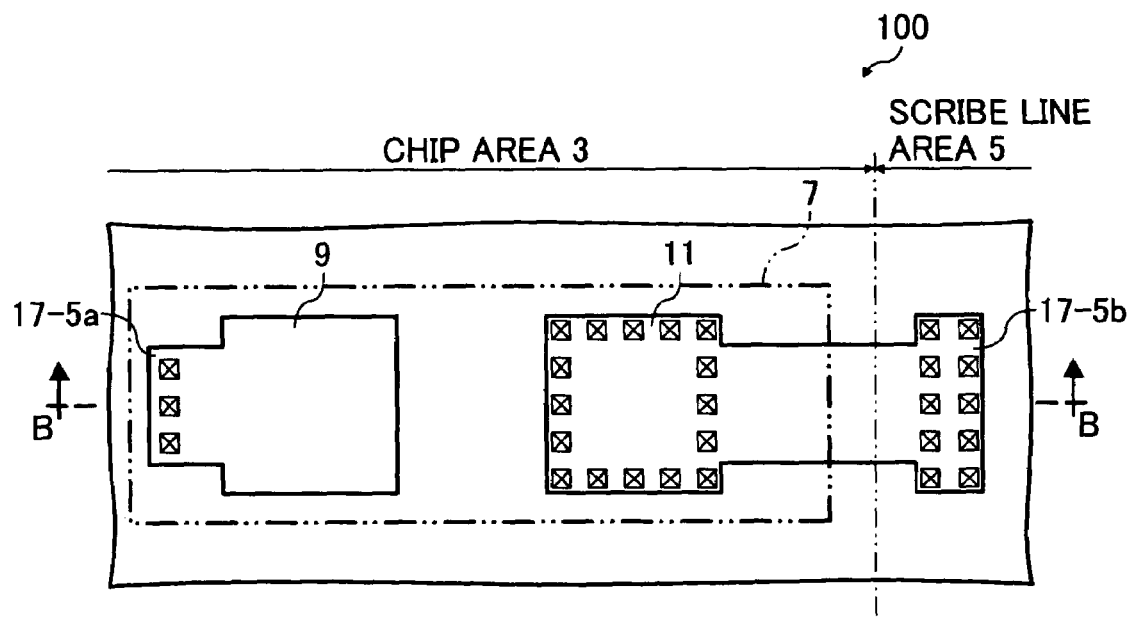
FIG. 5A is an enlarged plan view illustrating a pad adjacent portion of a semiconductor wafer according to an exemplary embodiment of the present specification.
Figure 5B:
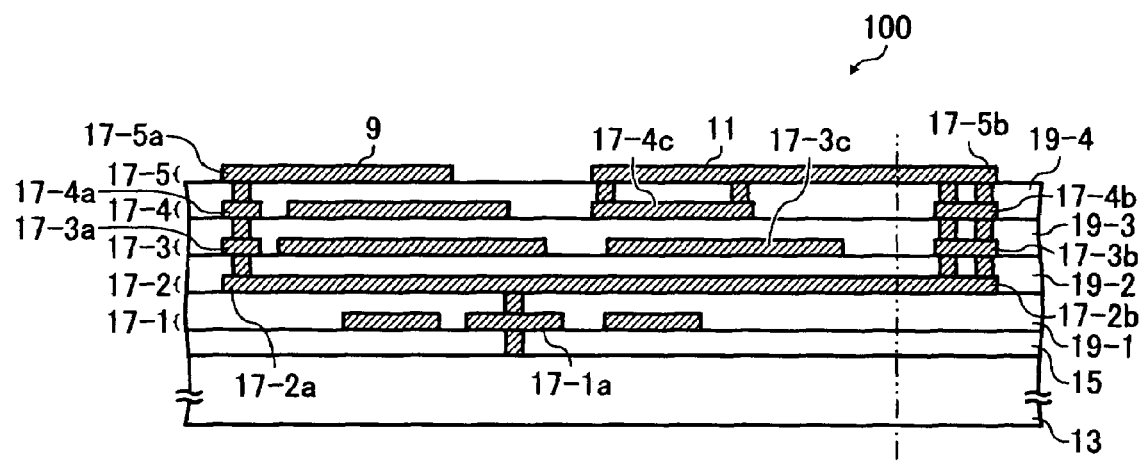
FIG. 5B is a cross-sectional view of the pad adjacent portion seen from a section B-B in FIG. 5A.

FIG. 5A is an enlarged plan view illustrating a pad adjacent portion of the semiconductor wafer 100 according to the present exemplary embodiment. FIG. 5B is a cross-sectional view of the pad adjacent portion seen from a section B-B in FIG. 5A.

Figure 6:
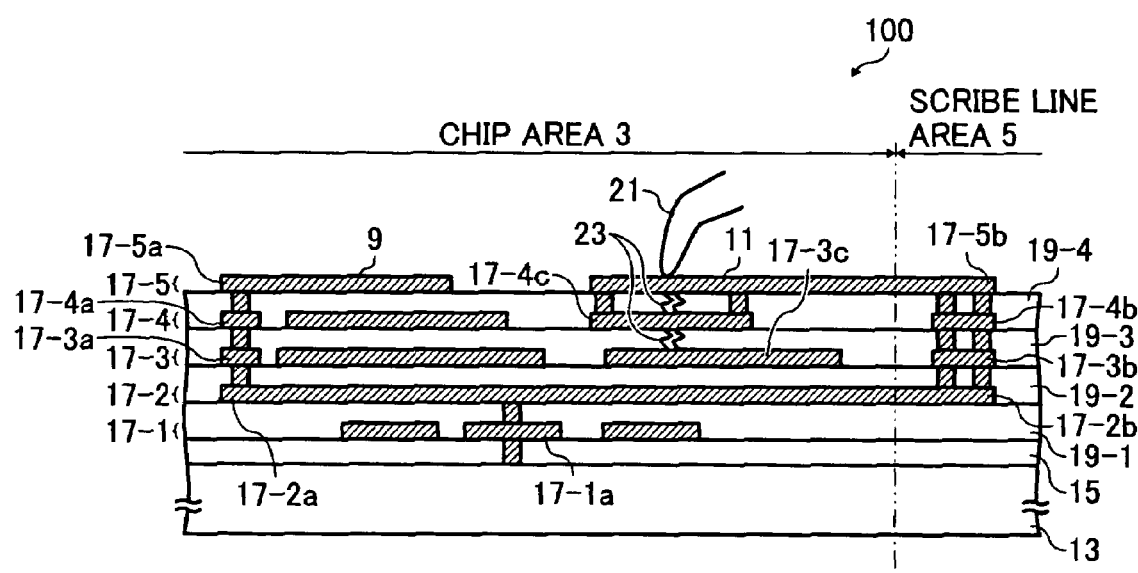
FIG. 6 is a cross-sectional view illustrating a state of the pad adjacent portion of FIG. 5A during a wafer test.
Figure 7:
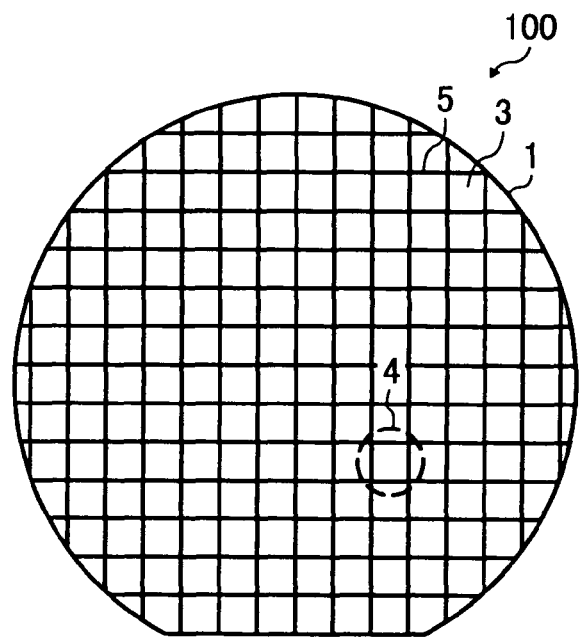
FIG. 7 is an overall plan view of the semiconductor wafer of FIG. 5A.
Figure 8:
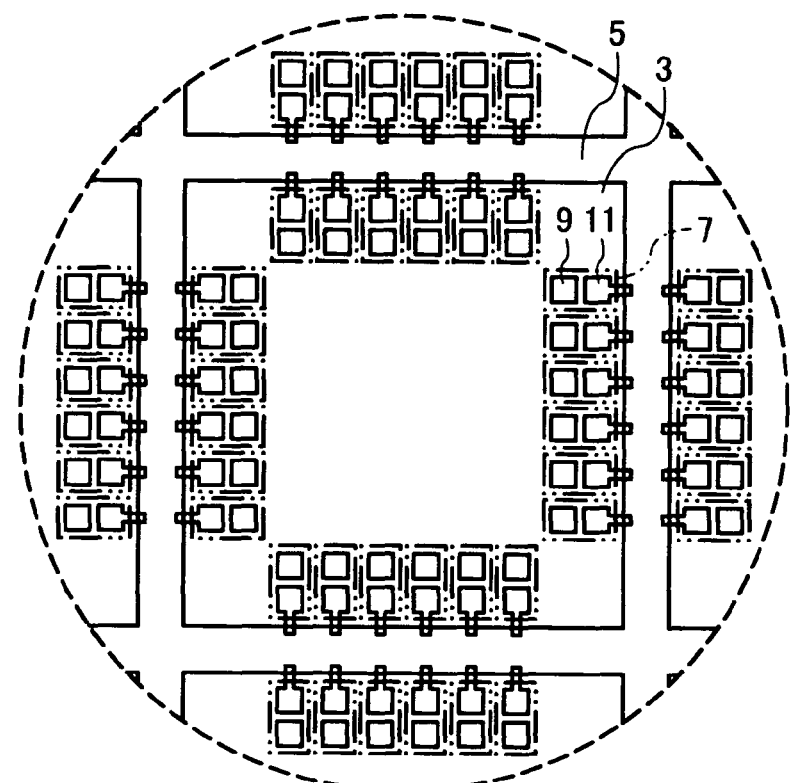
FIG. 8 is an enlarged plan view of a portion indicated by a dashed circle line 4 of FIG. 7.

FIG. 6 is a cross-sectional view illustrating a state of the pad adjacent portion during a wafer test. FIG. 7 is an overall plan view of the semiconductor wafer 100. FIG. 8 is an enlarged plan view of a portion indicated by a dashed circle line 4 of FIG. 7.

Incidentally, elements, such as a transistor, are not illustrated in FIGS. 5A, 5B, and 6. Further, a final protection film is not illustrated in FIGS. 5A, 5B, 6, and 8.

Furthermore, as illustrated in FIG. 7, the semiconductor wafer 100 is provided with a plurality of chip areas 3 that are arranged in a matrix form. The plurality of chip areas 3 are separated from each other by a scribe line area 5. A plurality of elements and pads (not illustrated) for process monitoring are located on the scribe line area 5.

As illustrated in FIG. 8, a plurality of input-and-output cells 7 are arranged in the periphery of each of the plurality of chip areas 3. A bonding pad 9 and a probing pad 11 are located on each of the plurality of input-and-output cells 7. The bonding pad 9 is electrically connected with an external terminal. The probing pad 11 is contacted with a probe wire.

Next, referring to FIGS. 5A and 5B, a configuration of the pad adjacent portion is described.

The semiconductor wafer 100 includes the bonding pad 9, the probing pad 11, a semiconductor substrate 13, a poly-metal inter-layer insulation film 15, metal wiring layers 17-1 to 17-5, and inter-layer insulation film 19-1 to 19-4.

The semiconductor substrate 13 is provided with an element, such as a transistor, and an element separation oxide film (neither of which is illustrated) thereon. The poly-metal inter-layer insulation film 15 is formed on the semiconductor substrate 13. The poly-metal inter-layer insulation film 15 has a contact hole at a given position. A conductive material such as tungsten is filled into the contact hole.

The metal wiring layers 17-1 to 17-5 are sequentially superimposed on the poly-metal inter-layer insulation layer 15. The inter-layer insulation layers 19-1 to 19-4 are formed between the metal wiring layers 17-1 to 17-5. The bonding pad 9 and the probing pad 11 are formed in the metal wiring layer 17-5, which is configured as an uppermost metal wiring layer. The bonding pad 9 and the probing pad 11 are located at a predetermined distance from each other.

The final protection layer (not illustrated) is formed on the inter-layer insulation layer 19-4 and the metal wiring layer 17-5. The final protection layer has openings at positions corresponding to the bonding pad 9 and the probing pad 11. Thus, the metal wiring layer 17-5 are partially exposed at the openings.

The metal wiring layer 17-5 includes a metal wiring layer 17-5a and a metal wiring layer 17-5b. The metal wiring layer 17-5a is extended from the bonding pad 9, and is electrically connected to a metal wiring layer 17-1a through a via hole, a metal wiring layer 17-4a, a via hole, a metal wiring layer 17-3a, a via hole, a metal wiring layer 17-2a, and a via hole.

One end of the metal wiring layer 17-5b is extended from the probing pad 11, and is located in the scribe line area 5. A metal wiring layer 17-4b, a metal wiring layer 17-3b, and a metal wiring layer 17-2b are formed under the metal wiring layer 17-5b in the scribe line area 5. The metal wiring layer 17-4b, the metal wiring layer 17-3b, and the metal wiring layer 17-2b are electrically connected through via holes.

The metal wiring layer 17-2b is connected to the metal wiring layer 17-2a, an opposite end of the metal wiring layer 17-2. Further, the metal wiring layer 17-2a is electrically connected to the bonding pad 9. Specifically, the probing pad 11 is electrically connected to the probing pad 11 through the metal wiring layers 17-5b, 17-4b, 17-3b, 17-2b, 17-2a, 17-3a, 17-4a, 17-5a, and the via holes. The metal wiring layers 17-2b, 17-3b, 17-4b, and 17-5b constitutes a wiring (hereafter, "pad connection wiring") to connect the bonding pad 9 to the probing pad 11.

A protection metal layer 17-4c, which constitutes a portion of a fourth metal wiring layer, is formed under the probing pad 11. The probing pad 11 and the protection metal layer 17-4c are electrically connected to each other through via holes.

An internal wiring 17-3c, which constitutes a portion of a third metal wiring layer, is located under the protection metal layer 17-4c.

During a wafer test, the probing pad 11 and the probe wire 21 are kept in contact with each other, as illustrated in FIG. 6. Then, the contact of the probe wire 21 may cause a crack 23 in the inter-layer insulation layers 19-3 and 19-4.

Incidentally, as described above, if the above-described state is left over time, the crack 23 may cause corrosion, resulting in a short circuit between the metal wiring layers. In this configuration as illustrated in FIG. 6, a short circuit may be caused between the probing pad 11 and the internal wiring 17-3a.

Therefore, according to the present exemplary embodiment, as described below, the bonding pad 9 and the probing pad 11 are electrically separated from each other so as to suppress the short circuit when the scribe line area 5 is cut out.

Figure 9:
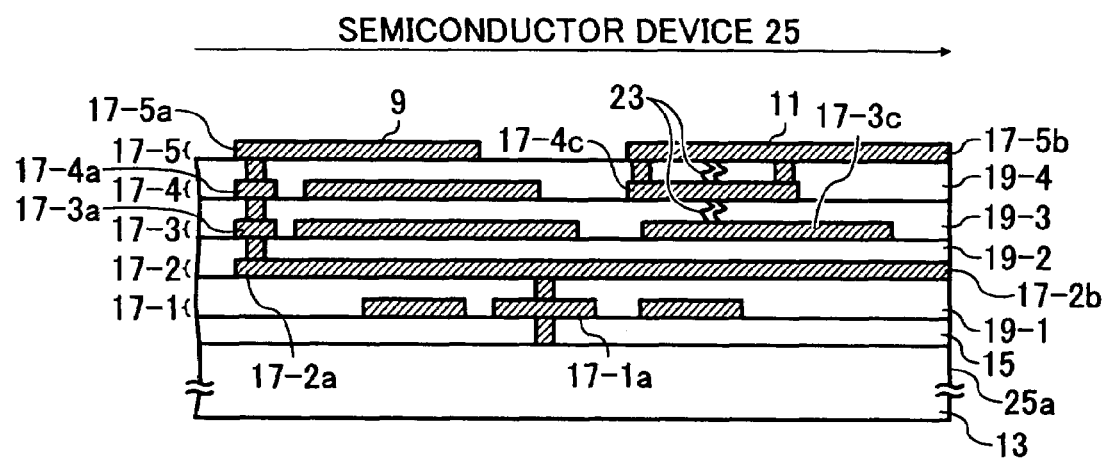
FIG. 9 is a cross-sectional view illustrating the pad adjacent portion of a semiconductor device formed by cutting the semiconductor wafer illustrated in FIG. 5A.

FIG. 9 is a cross-sectional view illustrating a pad adjacent portion of a semiconductor device 25 formed by cutting the semiconductor wafer 100 illustrated in FIG. 5A. The semiconductor device 25 is formed by cutting out the chip area 3 along the scribe line area 5 of the semiconductor wafer 100 illustrated in FIG. 5A.

Below, a method for manufacturing the semiconductor device 25 is described with reference to FIGS. 6 and 9.

After a wafer test is performed while contacting the probe wire 21 to the probing pad 11 as illustrated in FIG. 6, the semiconductor wafer 100 is diced along the scribe line area 5. At this time, an end of the metal wiring layer 17-5b opposite to the probing pad 11, the metal wiring layer 17-4b, the metal wiring layer 17-3b, and an end of the metal wiring layer 17-2b opposite to the metal wiring layer 17-2a are removed together with the scribe line area 5. Thus, the bonding pad 9 and the probing pad 11 are electrically separated from each other.

Next, a configuration of the semiconductor device 25 is described with reference to the FIG. 9.

As described above, the semiconductor device 25 according to the present exemplary embodiment has a configuration in which the bonding pad 9 and the probing pad 11 are electrically separated from each other. Further, cross sections of the metal wiring layer 17-5b and the metal wiring layer 17-2b are exposed on a cut surface 25a of the scribe line area 5. The metal wiring layer 17-5b is electrically connected to the bonding pad 9, while the metal wiring layer 17-2b is electrically connected to the probing pad 11.

The semiconductor wafer 100 has a configuration in which the bonding pad 9 and the probing pad 11 are located at a given distance from each other in the chip area 3. As illustrated in FIG. 5A, the semiconductor wafer 100 also includes the metal wiring layers 17-2b, 17-3b, 17-4b, and 17-5b. A portion of each of the metal wiring layers 17-2b and 17-5b and an entire portion of each of the metal wiring layers 17-3b and 17-4b are located in the scribe line area 5.

Then, the chip area 3 is cut out from the semiconductor wafer 100 along the scribe line area 5 so as to form the semiconductor device 25. At this time, the portion of each of the metal wiring layers 17-2b and 17-5b and the entire portion of each of the metal wiring layers 17-3b and 17-4b are cut off. Therefore, in the semiconductor device 25, the bonding pad 9 and the probing pad 11 are electrically separated from each other.

Thus, as illustrated in FIG. 9, even when the internal wiring 17-3c is located under the probing pad 11, and a crack 23 is caused under the probing pad 11 by the contact of the probing wire 21, a short circuit can be suppressed between the internal wiring 17-3c and the bonding pad 9.

At this time, a short circuit may be caused between the internal wiring 17-3c and the probing pad 11 by the crack 23. However, as described above, the short circuit can be suppressed between the internal wiring 17-3c and the bonding pad 9. Further, since the pad connection wiring is cut off in cutting out the semiconductor device 25, the probing pad 11 becomes electrically in a floating state. Therefore, a failure possibly caused by the crack 23 can be effectively suppressed in the semiconductor device 25.

According to the present exemplary embodiment, the metal wiring layer 17-2b, which constitutes a portion of the pad connection wiring, is located under the probing pad 11. Alternatively, as illustrated in FIGS. 10A and 10B, the metal wiring layer 17-2b may be located at a position that is not under the probing pad 11 in order to connect between the metal wiring layers 17-2b and 17-2a.

Figure 10A:
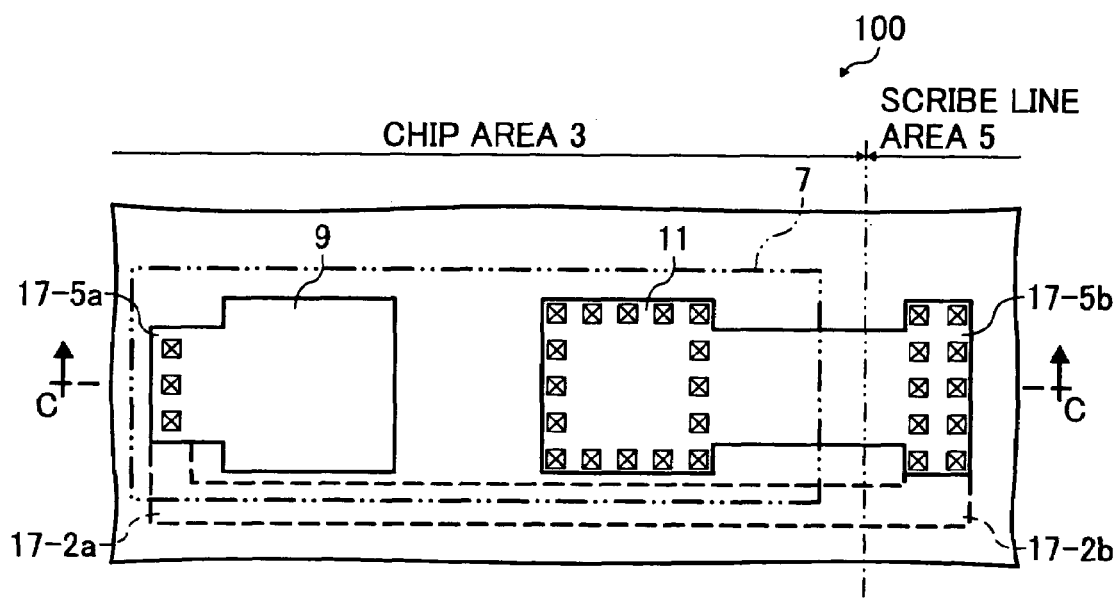
FIG. 10A is a cross-sectional view illustrating a pad adjacent portion of a semiconductor wafer according to another exemplary embodiment of the present specification.
Figure 10B:
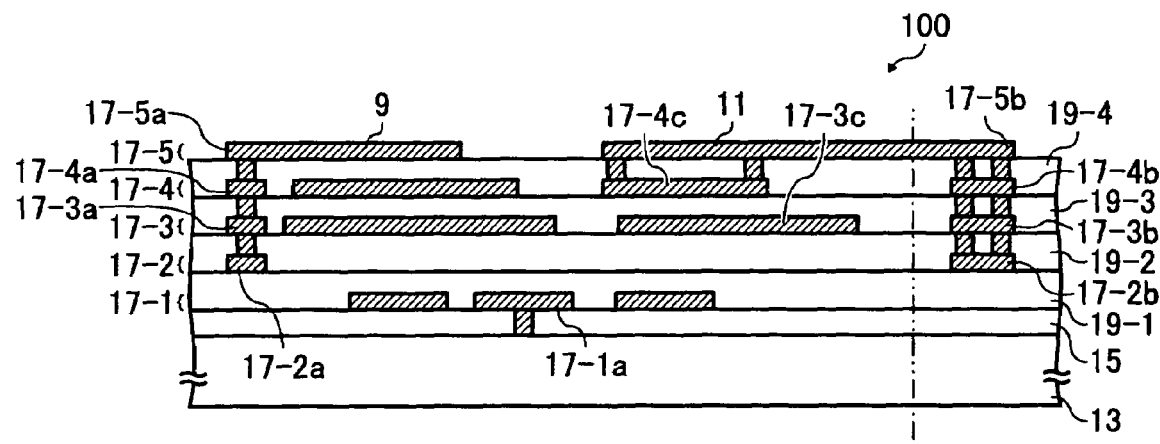
FIG. 10B is a cross-sectional view of the pad adjacent portion seen from a section C-C in FIG. 10A.
Figure 11:
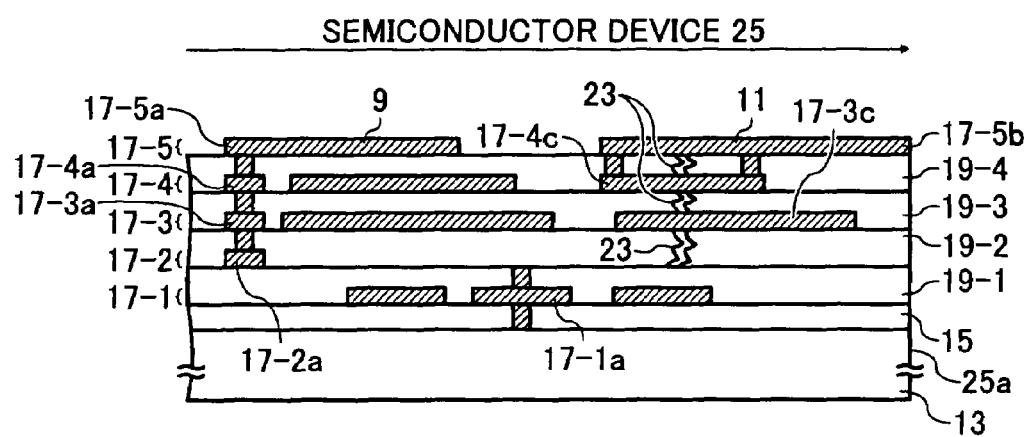
FIG. 11 is a cross-sectional view illustrating the pad adjacent portion of a semiconductor device formed by cutting the semiconductor wafer illustrated in FIG. 10A.

FIG. 11 is a cross-sectional view illustrating a pad adjacent portion of a semiconductor device 25 formed by cutting the semiconductor wafer 100 illustrated in FIGS. 10A and 10B. Specifically, the semiconductor device 25 is formed by cutting out the chip area 3 along the scribe line area 5 of the semiconductor wafer 100 as illustrated in FIGS. 10A and 10B.

Below, a method for manufacturing the semiconductor device 25 is described with reference to FIGS. 10A, 10B, and 11.

After a wafer test is performed while contacting a probe wire to the probing pad 11, the semiconductor wafer 100 is diced along the scribe line area 5. At this time, an end of the metal wiring layer 17-5b opposite to the probing pad 11, the metal wiring layer 17-4b, the metal wiring layer 17-3b, and end of the metal wiring layer 17-2b opposite to the metal wiring layer 17-2a are removed together with the scribe line area 5. Thus, the bonding pad 9 and the probing pad 11 are electrically separated from each other as illustrated in FIG. 11.

According to the present exemplary embodiment, even when a crack 23 is caused under the internal wiring 23 by the contact of the probe wire, a short circuit can be suppressed between the bonding pad 9 and the probing pad 11.

In the present exemplary embodiment as illustrated in FIGS. 10A, 10B, and 11, the bonding pad 9 and the probing pad 11 are electrically connected to each other by disposing the metal wiring layer 17-2b so as to straddle the chip area 3 and the scribe line area 5. However, the exemplary embodiment of the present specification is not limited to the configuration as illustrated in FIGS. 10A, 10B, and 11. Any metal wiring layer may be located so as to straddle the chip area 3 and the scribe line area 5 to electrically connect the bonding pad 9 to the probing pad 11.

Figure 12A:
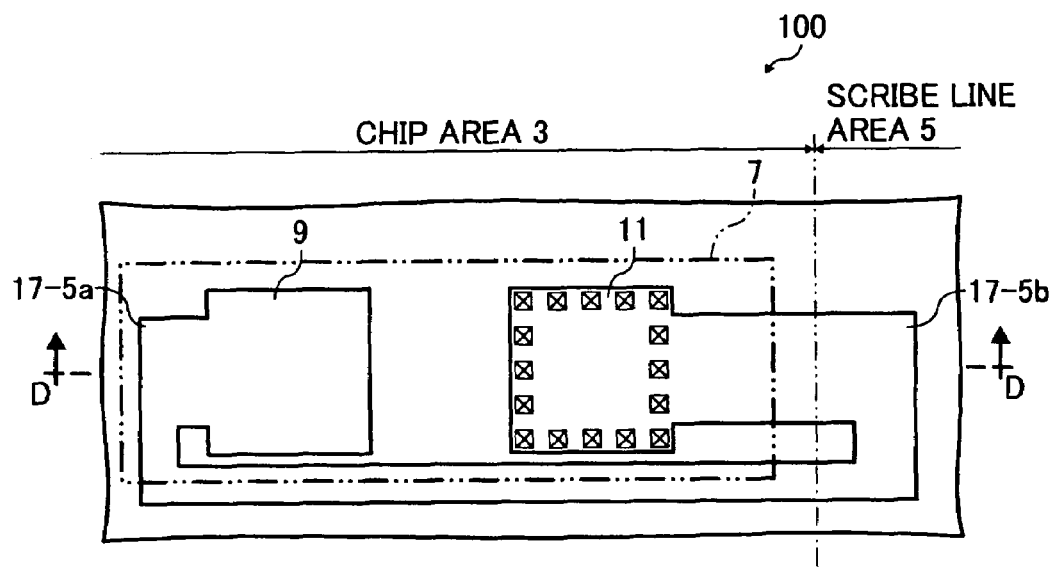
FIG. 12A is a cross-sectional view illustrating a pad adjacent portion of a semiconductor wafer according to another exemplary embodiment of the present specification.
Figure 12B:
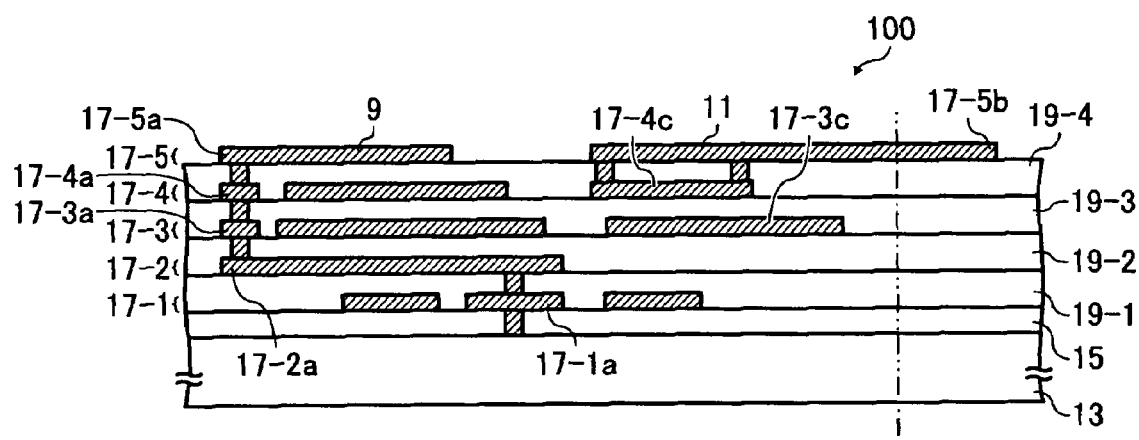
FIG. 12B is a cross-sectional view of the pad adjacent portion seen from a section D-D in FIG. 12A.

FIGS. 12A and 12B are enlarged views of a pad adjacent portion of a semiconductor wafer 100 according to another exemplary embodiment of the present specification. FIG. 12A is a plan view of the pad adjacent portion, while FIG. 12B is a cross-sectional view of the pad adjacent portion seen from a section D-D in FIG. 12A. In FIGS. 12A and 12B, components substantially similar in function to components in FIGS. 5A and 5B are indicated by identical codes, and repeated descriptions of the components are omitted.

In the present exemplary embodiment illustrated in FIGS. 12A and 12B, the metal wiring layer 17-5b is extended from the probing pad 11, is led into the scribe line area 5, and is turned back into the chip area 3 to be connected to the metal wiring layer 17-5a.

Further, unlike the exemplary embodiment illustrated in FIGS. 5A and 5B, the semiconductor device 100 illustrated in FIGS. 12A and 12B does not include the metal wiring layers 17-2b, 17-3b, and 17-4b, and the via holes through which the metal wiring layers 17-2b, 17-3b, and 17-4b is connected to the metal wiring layer 17-5b. Therefore, according to the present exemplary embodiment, the metal wiring layer 17-5b constitutes a portion of the pad connection wiring to connect the bonding pad 9 to the probing pad 11.

Figure 13:
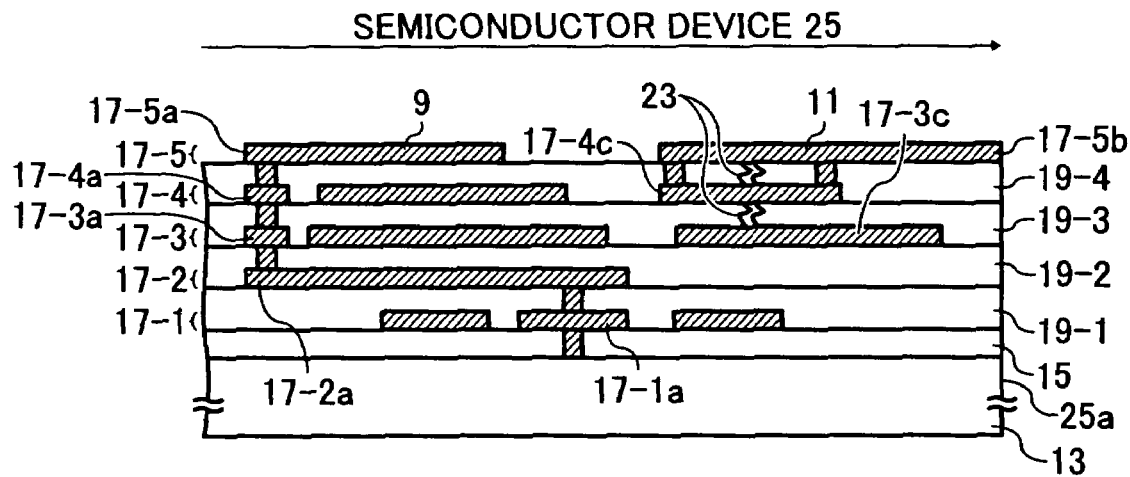
FIG. 13 is a cross-sectional view illustrating the pad adjacent portion of a semiconductor device formed by cutting the semiconductor wafer illustrated in FIG. 12A.

FIG. 13 is a cross-sectional view illustrating a semiconductor device 25 formed by cutting the semiconductor wafer 100 illustrated in FIGS. 12A and 12B. Specifically, the semiconductor device 25 is formed by cutting out the chip area 3 along the scribe line area 5 of the semiconductor wafer 100 illustrated in FIGS. 12A and 12B.

Below, a manufacturing method of the semiconductor device 25 is described with reference to FIGS. 12A, 12B, and 13.

After a wafer test is performed while contacting a probe wire to the probing pad 11, the semiconductor wafer 100 is diced along the scribe line area 5. At this time, a portion of the metal wiring layer 17-5b located in the scribe line area 5 is removed together with the scribe line area 5. Thus, the bonding pad 9 and the probing pad 11 are electrically separated from each other as illustrated in FIG. 13.

According to the present exemplary embodiment, even when a crack 23 is caused under the probing pad 11 by the contact of the probe wire, a short circuit can be suppressed between the bonding pad 9 and the probing pad 11.

Further, since the bonding pad 9, the probing pad 11, and the metal wiring layer 17-5b are formed in an uppermost metal wiring layer, the bonding pad and the probing pad are easy to form. Alternatively, the bonding pad 9, the probing pad 11, and the pad connection wiring may be formed in any other metal wiring layer than the uppermost metal wiring layer.

Furthermore, since the bonding pad 9, the probing pad 11, and the metal wiring layer 17-5b constituting the pad connection wiring are formed in a single metal wiring layer, the wiring structure of the pad connection wiring can be simplified. Thus, the present exemplary embodiment is applicable to a semiconductor device having a single-layer metal wiring structure of chip area.

According to the present exemplary embodiment illustrated in FIGS. 12A, 12B, and 13, the bonding pad 9 is located near the center of the chip area 3 on the input-and-output cell 7. On the other hand, the probing pad 11 is located near the scribe line area 5 on the input-and-output cell 7. Alternatively, the probing pad 11 may be located near the center of the chip area 3 on the input-and-output cell 7, while the bonding pad 9 may be located near the scribe line area 5.

Moreover, according to the present exemplary embodiment, the bonding pad 9 and the probing pad 11 are located on the input-and-output cell 7. However, the positions of the bonding pad 9 and the probing pad 11 are not limited to the above disposition.

In addition, according to the present exemplary embodiment, the probing pad 11 is entirely located in the chip area 3. Alternatively, a portion of the probing pad 11 may be located in the scribe line area 5.

Figure 14A:
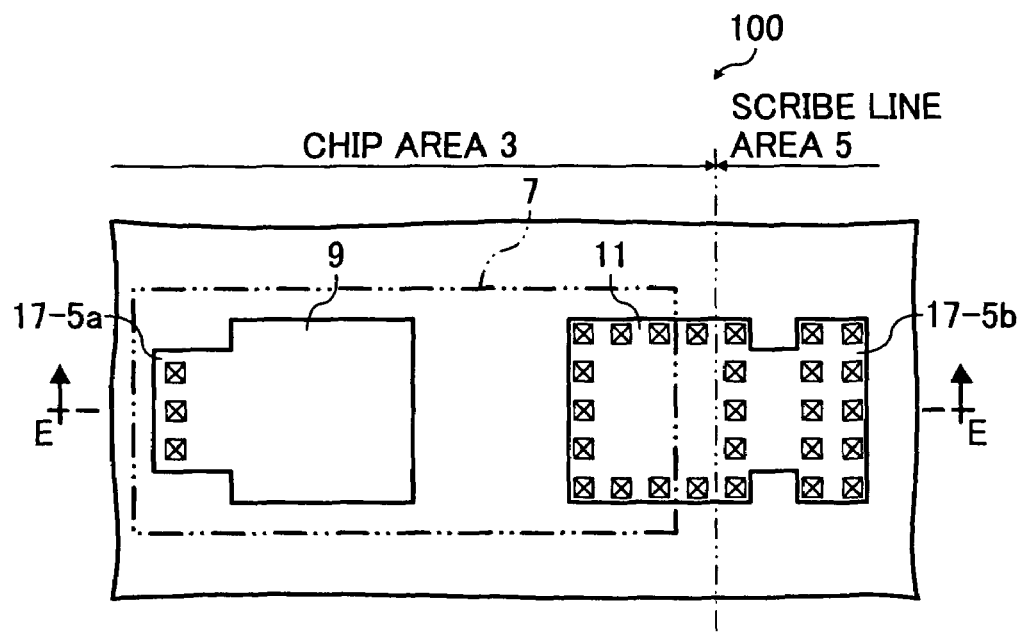
FIG. 14A is a cross-sectional view illustrating a pad adjacent portion of a semiconductor wafer according to another exemplary embodiment of the present specification.
Figure 14B:
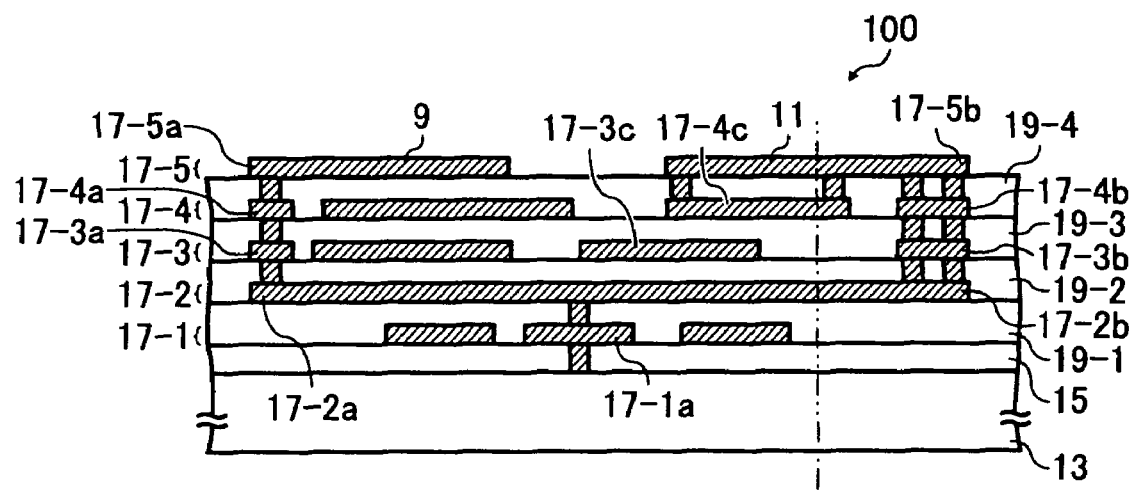
FIG. 14B is a cross-sectional view of the pad adjacent portion seen from a section E-E in FIG. 14A.

FIGS. 14A and 14B are enlarged diagrams illustrating a pad adjacent portion of the semiconductor wafer 100 according to another exemplary embodiment of the present specification. FIG. 14A is a plan view of the pad adjacent portion, while FIG. 14B is a cross-sectional view of the pad adjacent portion seen from a section E-E in FIG. 14A.

In FIGS. 14A and 14B, components substantially similar in function to components in FIGS. 5A and 5B are indicated by identical codes, and repeated descriptions of the components are omitted. Incidentally, according to the present exemplary embodiment, as described above, a portion of the probing pad 11 is located in the scribe line area 5.

Figure 15:
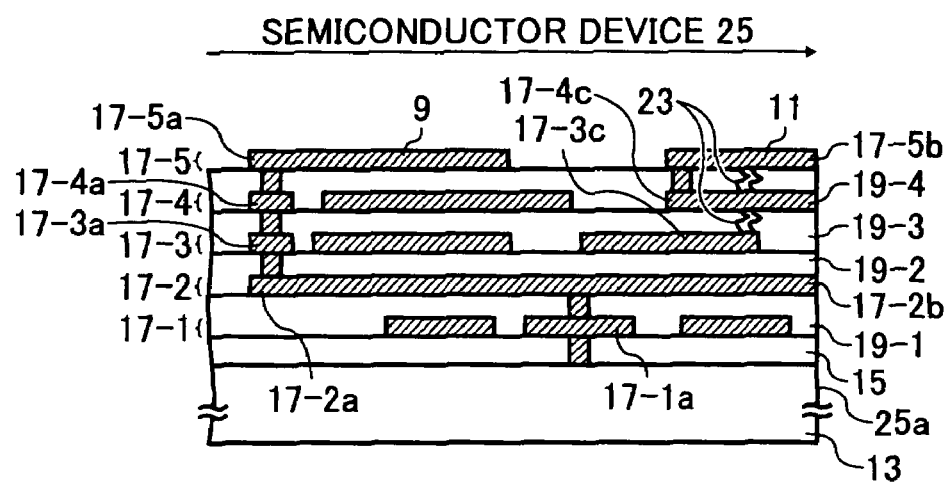
FIG. 15 is a cross-sectional view illustrating the pad adjacent portion of a semiconductor device formed by cutting the semiconductor wafer illustrated in FIG. 14A.

FIG. 15 is a cross-sectional view illustrating a pad adjacent portion of a semiconductor device 25 formed by cutting the semiconductor wafer 100 illustrated in FIGS. 14A and 14B. Specifically, the semiconductor device 25 is formed by cutting out the chip area 3 along the scribe line 5 of the semiconductor wafer 300 illustrated in FIGS. 14A and 14B.

Below, a manufacturing method of the semiconductor device 25 is described with reference to FIGS. 14A, 14B, and 15.

After a wafer test is performed while contacting a probe wire to the probing pad 11, the semiconductor wafer 100 is diced along the scribe line area 5. At this time, a portion of the probing pad 11 located in the scribe line area 5, the metal wiring layer 17-5b, the metal wiring layer 17-4b, the metal wiring layer 17-3b, and an end of the metal wiring layer 17-2b opposite to the metal wiring layer 17-2a are removed together with the scribe line area 5. Thus, the bonding pad 9 and the probing pad 11 are electrically separated from each other as illustrated in FIG. 15.

Next, referring to FIG. 15, a configuration of the semiconductor device 25 is described.

As described above, in the semiconductor device 25, the bonding pad 9 and the probing pad 11 are electrically separated from each other. Cross sections of the metal wiring layer 17-2b and the residue of the probing pad 11 are exposed on a cut surface 25a of the scribe line area 5. The metal wiring layer 17-2b is electrically connected to the bonding pad 9.

According to the present exemplary embodiment, even when a crack 23 is caused under the probing pad 11 by the contact of the probe wire, a short circuit can be suppressed between the bonding pad 9 and the probing pad 11. Further, since a portion of the probing pad 11 is located in the scribe line area 5, an area occupied by the probing pad 11 in the chip area 3 can be reduced. Therefore, the chip area 3 can be downsized.

The above configuration, in which a portion of the probing pad 11 is located in the scribe line area 5, is applicable to the above-described exemplary embodiments as illustrated in FIGS. 10A, 10B, 11, 12A, 12B, and 13. In those exemplary embodiments, the chip area 3 can be effectively downsized similar to the present embodiment.

Figure 16A:
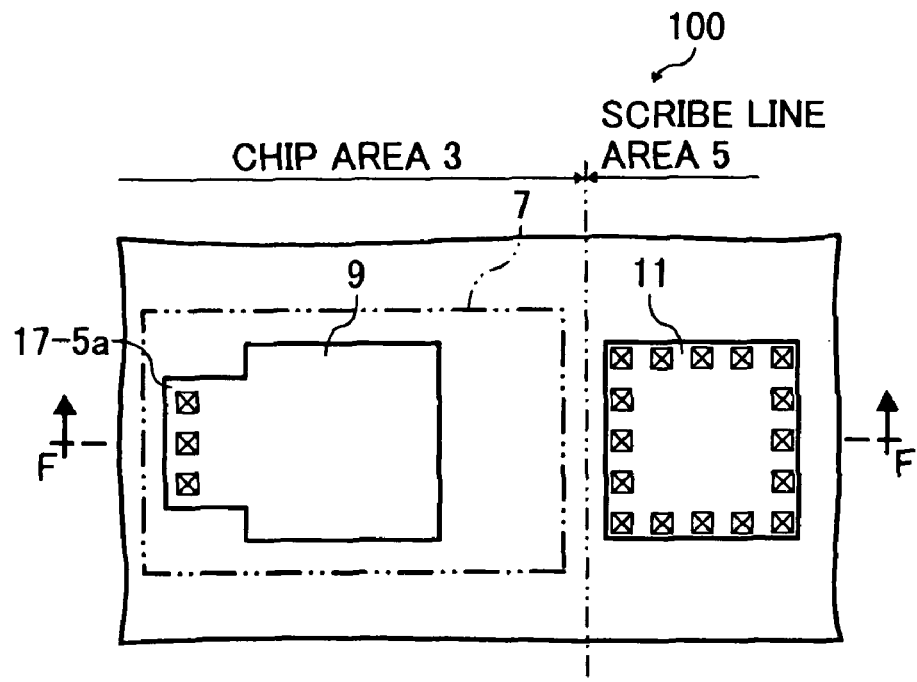
FIG. 16A is a cross-sectional view illustrating a pad adjacent portion of a semiconductor wafer according to another exemplary embodiment of the present specification.
Figure 16B:
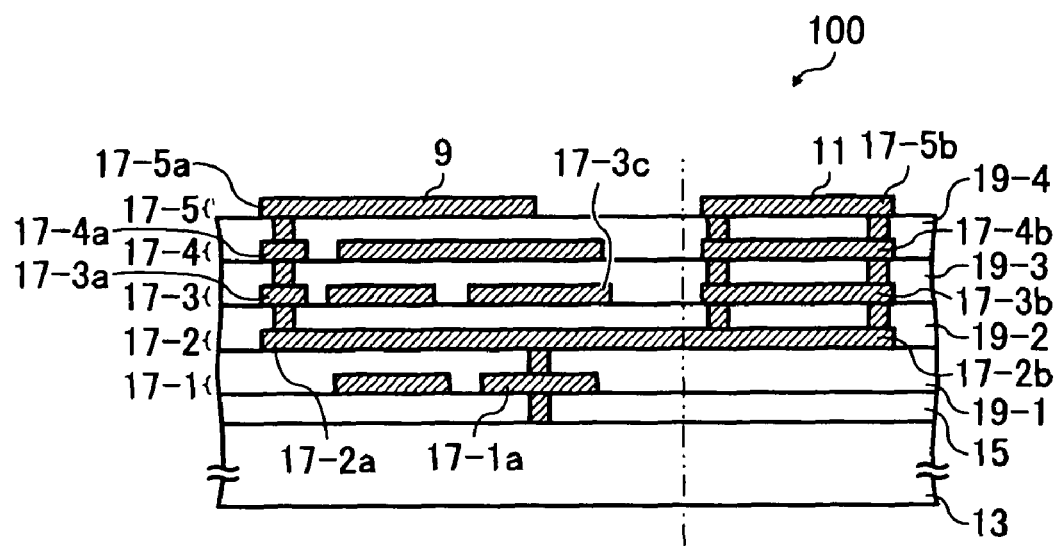
FIG. 16B is a cross-sectional view of the pad adjacent portion seen from a section F-F in FIG. 16A.

Alternatively, an entire portion of the probing pad 11 may be located in the scribe line area 5 as illustrated in FIGS. 16A and 16B.

FIGS. 16A and 16B are enlarged diagrams illustrating a pad adjacent portion of a semiconductor wafer 100 according to another exemplary embodiment of the present specification. FIG. 16A is a plan view of the pad adjacent portion, while FIG. 16B is a cross-sectional view of the pad adjacent portion seen from a section F-F in FIG. 16A. In FIGS. 16A and 16B, components substantially similar in function to components in FIGS. 5A and 5B are indicated by identical codes, and repeated descriptions of the components are omitted.

According to the present exemplary embodiment illustrated in FIGS. 16A and 16B, an entire portion of the probing pad 11 is located in the scribe line area 5. Further, the semiconductor device 100 according to the present exemplary embodiment does not include the metal wiring layer 17-5b and the protection metal layer 17-4c. The metal wiring layers 17-2b, 17-3b, 17-4b, and via holes are formed under the probing pad 11, and constitute the pad connection wiring for connecting the bonding pad 9 and the probing pad 11. Since the entire portion of the probing pad 11 is located in the scribe line area 5, the internal wiring 17-3c is not located under the probing pad 11.

Figure 17:
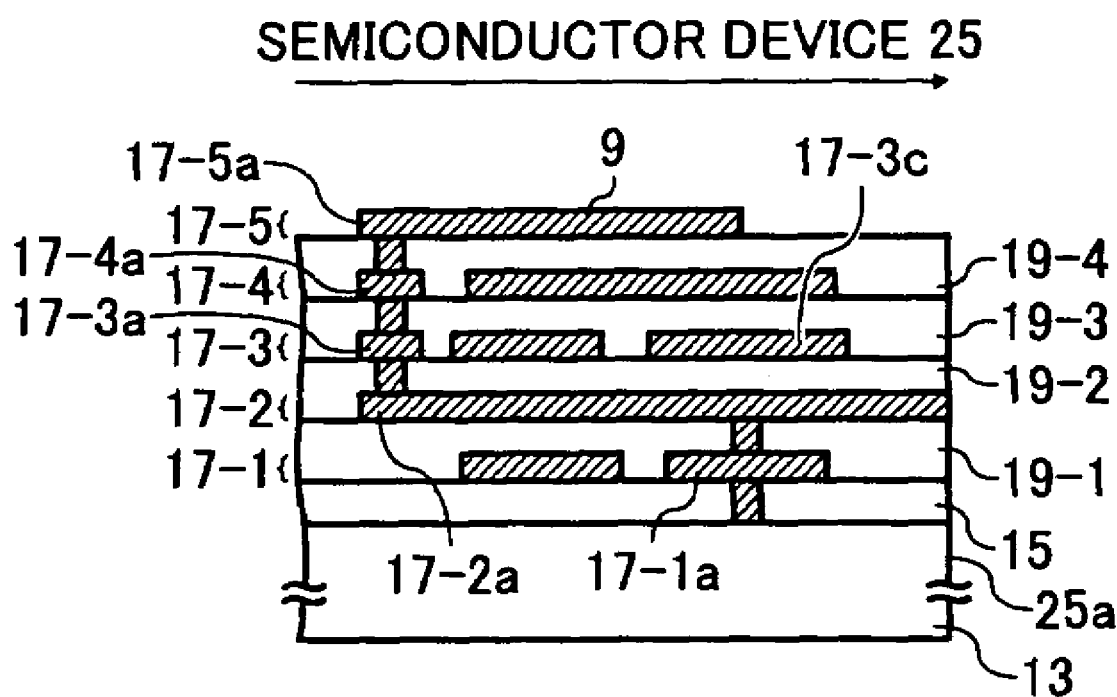
FIG. 17 is a cross-sectional view illustrating the pad adjacent portion of a semiconductor device formed by cutting the semiconductor wafer illustrated in FIG. 16A.

FIG. 17 is a cross-sectional view illustrating of a pad adjacent portion of a semiconductor device 25 formed by cutting the semiconductor wafer 100 illustrated in FIGS. 16A and 16B. Specifically, the semiconductor device 25 is formed by cutting out the chip area 3 along the scribe line area 5 of the semiconductor wafer 100 illustrated in FIGS. 16A and 16B.

Below, a manufacturing method of the semiconductor device 25 is described with reference to FIGS. 16A, 16B, and 17.

After a wafer test is performed while contacting a probe wire to the probing pad 11, the semiconductor wafer 100 is diced along the scribe line area 5. At this time, the probing pad 11, the metal wiring layer 17-4b, the metal wiring layer 17-3b, and an end of the metal wiring layer 17-2b opposite to the metal wiring layer 17-2a are removed together with the scribe line area 5 as illustrated in FIG. 17.

Next, a configuration of the semiconductor device 25 is described referring to FIG. 17.

The semiconductor device 25 does not include the probing pad 11. A cross section of the metal wiring layer 17-2b is exposed on a cut surface 25a of the scribe line area 5. The metal wiring layer 17-2b is electrically connected to the bonding pad 9.

According to the present exemplary embodiment, the internal wiring 17-3c is not located under the probing pad 11. Further, even when damage is caused under the probing pad 11 by the contact of the probe wire, a short circuit can be suppressed between the internal wiring 23 and the bonding pad 9 because the probing pad 11 has been cut off together with the scribe line area 5.

Further, an area occupied by the probing pad 11 in the chip area 3 can be eliminated. Therefore, the chip area 3 can be effectively downsized.

According to the present exemplary embodiment illustrated in FIGS. 16A, 16B, and 17, the metal wiring layers 17-2b, 17-3b, 17-4b, and via holes, which constitute the pad connection wiring, are located under the probing pad 11. Further, the metal wiring layers 17-2a and 17-2b are connected to each other so as to electrically connect the probing pad 11 and the bonding pad 9.

In this configuration, the via holes may be formed at positions that are not under the probing pad 11. For example, the metal wiring layer 17-5 is extended from the probing pad 11, and the via holes are provided at positions that are not under the probing pad 11. Thus, the probing pad 11 and the metal wiring layer 17-2a may be electrically connected to each other through the metal wiring layer 17-5, and the metal wiring layers 17-2b, 17-3b, and 17-4b. In this configuration, the via holes may be formed in any of the chip area 3 and the scribe line area 5.

The above-described configuration, in which the probing pad 11 is entirely located in the scribe line area 5, is applicable to the above-described exemplary embodiments illustrated in FIGS. 10A, 10B, 11, 12A, 12B, and 13. In those exemplary embodiments, the chip area 3 can be effectively downsized similar to the present embodiment.

In the present exemplary embodiment, the above-described configuration is applied to a five-layer metal wiring structure of semiconductor wafer. Alternatively, the above-described configuration may be applied to a semiconductor wafer having a metal wiring structure of one or more layers. Further, the above-described configuration may be applied to a manufacturing method of a semiconductor device from the semiconductor wafer, and the resultant semiconductor device.

In the above-described exemplary embodiments having the probing pad 11 in the chip area 3, the protection metal layer 17-4c is located under the probing pad 11. Alternatively, the protection metal layer 17-4c may be omitted.

The above-described exemplary embodiments of this patent specification may be conveniently implemented using a conventional general purpose digital computer programmed according to the teachings of the present specification, as will be apparent to those skilled in the computer art. Appropriate software coding can readily be prepared by skilled programmers based on the teachings of the present disclosure, as will be apparent to those skilled in the software art. The subject matter of the present disclosure may also be implemented by the preparation of application specific integrated circuits or by interconnecting an appropriate network of conventional component circuits, as will be readily apparent to those skilled in the art.

Numerous additional modifications and variations are possible in light of the above teachings. It is therefore to be understood that within the scope of the appended claims, the disclosure of this patent specification may be practiced otherwise than as specifically described herein. For example, elements and/or features of different examples and illustrative embodiments may be combined with each other and/or substituted for each other within the scope of this disclosure and appended claims.

This patent specification is based on Japanese patent applications, No. JP2006-055998 filed on Mar. 2, 2006 in the Japan Patent Office, the entire contents of which are incorporated by reference herein.

What is claimed is:

1. A semiconductor wafer, comprising:
   a plurality of chip areas configured to be arranged in a matrix form; and
   a scribe line area configured to separate the plurality of chip areas from each other, wherein each of the chip areas includes:
      a bonding pad configured to be connected with an external terminal;
      a probing pad configured to be contacted with a probe wire; and
      a pad connection wiring configured to electrically connect the bonding pad to the corresponding probing pad,
   wherein the pad connection wiring includes a portion of at least one metal wiring layer of the semiconductor wafer, and a portion of the pad connection wiring is located in the scribe line area, and
   wherein in each of the chip areas, the corresponding bonding pad and the corresponding probing pad are located at a given interval from each other.

2. The semiconductor wafer according to claim 1, wherein said bonding pad, said probing pad and said pad connection wiring are included in a single layer of the at least one metal wiring layer.

3. The semiconductor wafer according to claim 2, wherein the single layer is an uppermost layer of the at least one metal wiring layer.

4. The semiconductor wafer according to claim 1, further comprising a plurality of metal wiring layers and a via hole,
   wherein the plurality of metal wiring layers are electrically connected to each other through the via hole, and
   wherein the pad connection wiring includes the plurality of metal wiring layers.

5. The semiconductor wafer according to claim 4, wherein the pad connection wiring is not located under the probing pad.

6. The semiconductor wafer according to claim 1, each chip area further comprising an input-and-output cell,
   wherein the bonding pad and the corresponding probing pad are located on a corresponding input-and-output cell.

7. The semiconductor wafer according to claim 1, further comprising a protection metal layer under the probing pad, wherein each protection metal layer is configured to prevent a crack from spreading below.

8. The semiconductor wafer according to claim 1, wherein each probing pad has a portion located in the scribe line area and a portion located in a corresponding chip area.

9. A semiconductor device, comprising:
   one chip area of the semiconductor wafer according to claim 1,
   wherein the semiconductor device is formed by cutting the semiconductor wafer along the scribe line area,
   wherein the bonding pad and the probing pad of the one chip area are electrically separated from each other by removing the portion of the corresponding pad connection wiring located in the scribe line area, and
   wherein the semiconductor device has a cut surface formed by cutting the semiconductor wafer along the scribe line area including a section of the pad connection wiring connected to the bonding pad and a section of the pad connection wiring connected to the probing pad.

10. A semiconductor device, comprising:
    one chip area of the semiconductor wafer according to claim 8,
    wherein the semiconductor device is formed by cutting the semiconductor wafer along the scribe line area,
    wherein the bonding pad and portion of the corresponding probing pad located in the chip area are electrically separated from each other by removing the portion of the corresponding pad connection wiring and portion of the probing pad located in the scribe line area, and
    wherein the semiconductor device has a cut surface formed by cutting the semiconductor wafer along the scribe line area including a section of the pad connection wiring connected to the bonding pad and a section of the portion of the probing pad located in the chip area.

11. The semiconductor wafer according to claim 1, wherein the pad connection wiring includes portions of a plurality of metal wiring layers and the portion of each pad connection wiring located in the scribe line area includes a via hole connecting portions of at least two metal wiring layers.

12. The semiconductor wafer according to claim 1, wherein
    the pad connection wiring includes portions of a plurality of metal wiring layers,
    the bonding pad and the probing pad are located in an uppermost metal wiring layer, and
    a portion of the pad connection wiring is formed in a metal wiring layer underneath at least one of a corresponding bonding pad and probing pad.

13. The semiconductor wafer according to claim 1, wherein each portion of the pad connection wiring located in the scribe line area is configured such that the corresponding bonding pad and the probing pad would be electrically separated from each other if the scribe line area were to be cut out of the semiconductor wafer.

14. The semiconductor wafer according to claim 1, wherein the bonding pad and the probing pad include a portion of the at least one metal wiring layer.

15. A semiconductor wafer, comprising:
a plurality of chip areas configured to be arranged in a matrix form, each of the chip areas including
  a corresponding probing pad configured to be contacted with a probe wire and formed in an uppermost metal wiring layer,
  a corresponding bonding pad formed in the uppermost metal wiring layer and configured to be connected with an external terminal, and
  a corresponding pad connection wiring electrically connecting the corresponding bonding pad to the corresponding probing pad; and
a scribe line area configured to separate the plurality of chip areas from each other; and
a plurality of metal wiring layers,
wherein the pad connection wiring includes a portion of at least one of the metal wiring layers of the semiconductor wafer, and a portion of the pad connection wiring is located in the scribe line area, and
wherein the probing pad is wholly located in the scribe line area.

16. The semiconductor wafer according to claim 13, wherein a portion of each pad connection wiring between the scribe line area and the chip area is formed in a metal wiring layer under the uppermost metal wiring layer.

* * * * *